United States Patent [19]

Ku

[11] Patent Number: 5,603,115
[45] Date of Patent: Feb. 11, 1997

[54] DIRECT BROADCASTING SATELLITE TUNER WITH AN AUTO THRESHOLD CONTROL DEMODULATOR

[75] Inventor: Hsi-Yung Ku, Taipei, Taiwan

[73] Assignee: Hwa Lin Electronics Co., Ltd., Taipei, Taiwan

[21] Appl. No.: 417,191

[22] Filed: Apr. 5, 1995

[51] Int. Cl.$^6$ .................. H04B 1/06; H04B 7/00
[52] U.S. Cl. ............. 455/254; 455/3.2; 455/232.1; 455/234.2; 455/312
[58] Field of Search .................. 455/3.2, 232.1, 455/234.1, 234.2, 2241.1, 253.2, 303, 312, 254, 266, 200.1, 337, 188.1; 348/731

[56] References Cited

U.S. PATENT DOCUMENTS

| | | | |
|---|---|---|---|
| 4,329,714 | 5/1982 | Pritchard | 455/312 |
| 4,726,072 | 2/1988 | Yamashita et al. | |
| 4,829,594 | 5/1989 | Heck et al. | 455/312 |
| 5,175,883 | 12/1992 | Ueno | 455/242.2 |
| 5,355,530 | 10/1994 | Ikeda | 455/212 |
| 5,483,297 | 1/1996 | Song | 348/737 |
| 5,521,650 | 5/1996 | Ku | 348/731 |

Primary Examiner—Reinhard J. Eisenzopf
Assistant Examiner—Gertrude Arthur
Attorney, Agent, or Firm—Bacon & Thomas

[57] ABSTRACT

A dual-input demodulating DBS (direct broadcasting satellite) tuner having an auto threshold demodulator circuit. Radio frequency input signal (950 MHZ–2050 MHZ) is amplified and converted into an intermediate frequency signal through low-pass filters, a radio frequency converter, a tracking filter, an attenuation circuit, and a microwave monolithic integrated circuit, and then demodulated by a second stage amplifier, a SAW filter and an auto threshold control demodulator, so as to regulate the threshold of the tuner according to the change of weather, enabling the tuner to match with the specification of the outdoor antenna.

7 Claims, 4 Drawing Sheets

DIRECT BROADCASTING SATELLITE TUNER WITH AN AUTO THRESHOLD CONTROL DEMODULATOR

BACKGROUND OF THE INVENTION (a) Field of the Invention

The present invention relates to tuners relates more particularly to a direct broadcasting satellite broad-band tuner which comprises an auto threshold control demodulator in which the auto threshold control circuit of the auto threshold control demodulator detects high frequency signal from the baseband signal, which is received from the demodulator circuit of the auto threshold control demodulator, and then converts the detected high frequency signal to DC voltage through a DC detector, so as to change the amount of electric current passing through the diode of the variable bandwidth circuit of the threshold control circuit, and therefore the receiving threshold of the tuner is regulated according to the change of weather condition and the specification of the antenna used, the receiving sensitivity of the tuner is improved, and the noise index is lowered.

(b) Description of the Prior Art

During the transmission of direct broadcasting satellite, audio and video signals are properly arranged at the ground transmitting station through a multiplexer, then modulated to an intermediate frequency signal and then amplified and turned into a radio signal for transemitting through a transmitting antenna. The ground receiving station has a low-noise broad-band receiver to receive radio signals. Upon receipt of a radio signal, the signal is amplified and turned into an intermediate frequency signal and then the intermediate frequency signal is further demodulated by a demodulator circuit to a baseband frequency signal containing a video signal and an audio signal. When the ground receiving station receives a useful electromagnetic wave signal from the atmosphere, interference waves and noises from the atmosphere may interfere with the receiving of the signal or pass into the signal, causing the reliability of the communication affected.

Furthermore, regular broadband satellite receiving tuners can receive weak signals well only when the set bandwidth and the used receiving antenna are matched. However, if the level of the satellite signal is changed and the specification of the receiving antenna can not match with such a change, the signal becomes out of the threshold of the tuner, and therefore noise signal will enter the tuner to interfere with its receiving operation, causing the quality of the picture of the TV affected.

SUMMARY OF THE INVENTION

The present invention has been accomplished to provide a direct broadcasting satellite tuner with an auto threshold control demodulator which eliminates the aforesaid drawbacks.

It is one object of the present invention to provide an auto threshold control demodulator for direct broadcasting satellite tuners which comprises an auto threshold control circuit, which detects high frequency signal from the baseband signal, which is received from the demodulator circuit of the auto threshold control demodulator, and then converts the detected high frequency signal to DC voltage through a DC detector, so as to change the amount of electric current passing through the diode of the variable bandwidth circuit of the threshold control circuit, and therefore the receiving threshold of the tuner is regulated according to the change of weather condition and the specification of the antenna used, the receiving sensitivity and output gain of the tuner is improved, and the noise index is lowered.

It is another object of the present invention to provide an auto threshold control demodulator for direct broadcasting satellite tuners which permits the size of the antenna to be greatly reduced to minimize its installation space without affecting the receiving quality of the tuner.

BRIEF DESCRIPTION OF THE DRAWINGS

The present invention will now be described by way of example with reference to the annexed drawings, in which.

DETAILED DESCRIPTION OF THE PREFERRED EMBODIMENT

Figure 1:
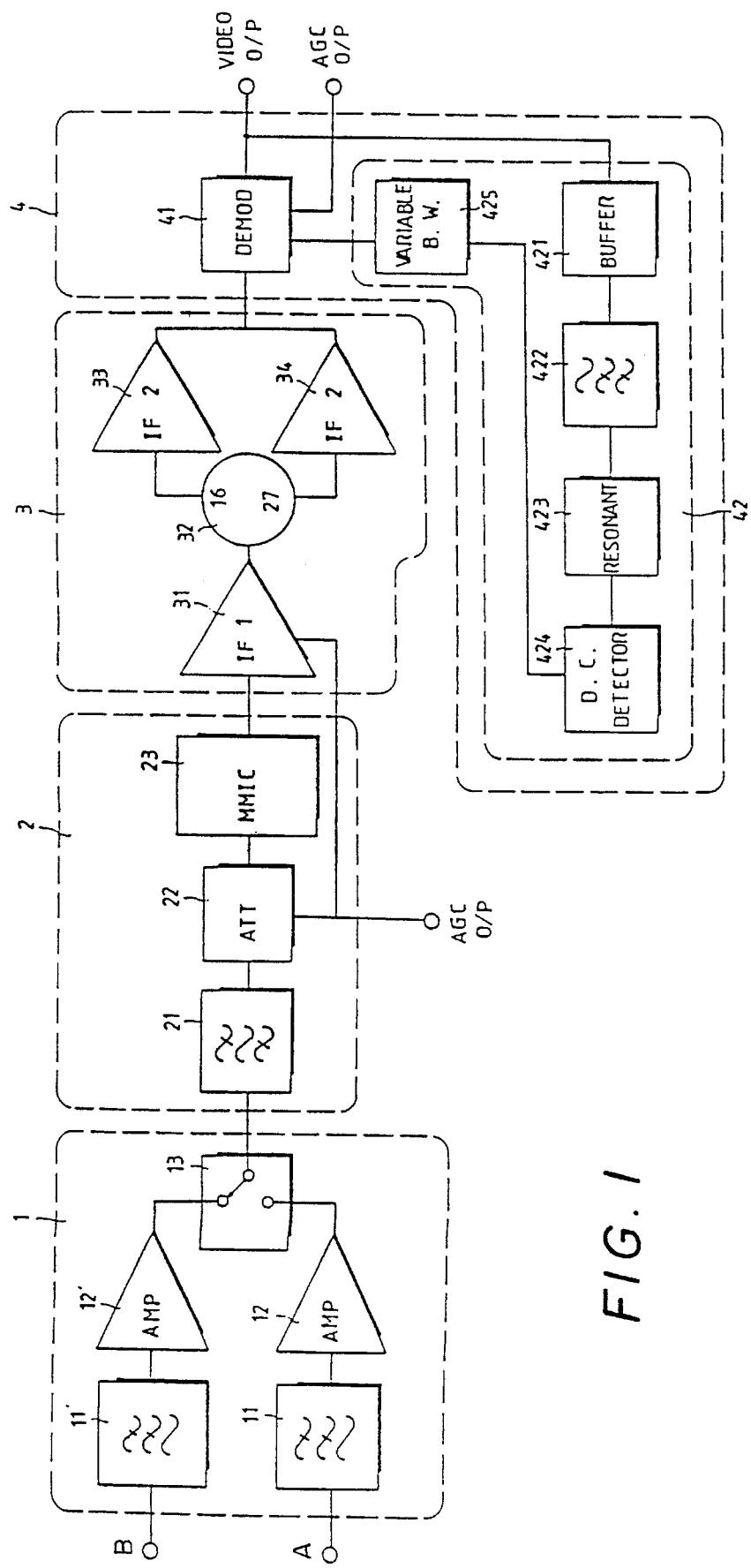
FIG. 1 is a circuit block diagram according to the present invention.

Referring to FIG. 1, a direct broadcasting satellite tuner with an auto threshold control demodulator in accordance with the present invention is generally comprised of radio frequency input device 1, frequency converter 2, intermediate frequency amplifier unit 3, and auto threshold control demodulator 4.

Figure 2:
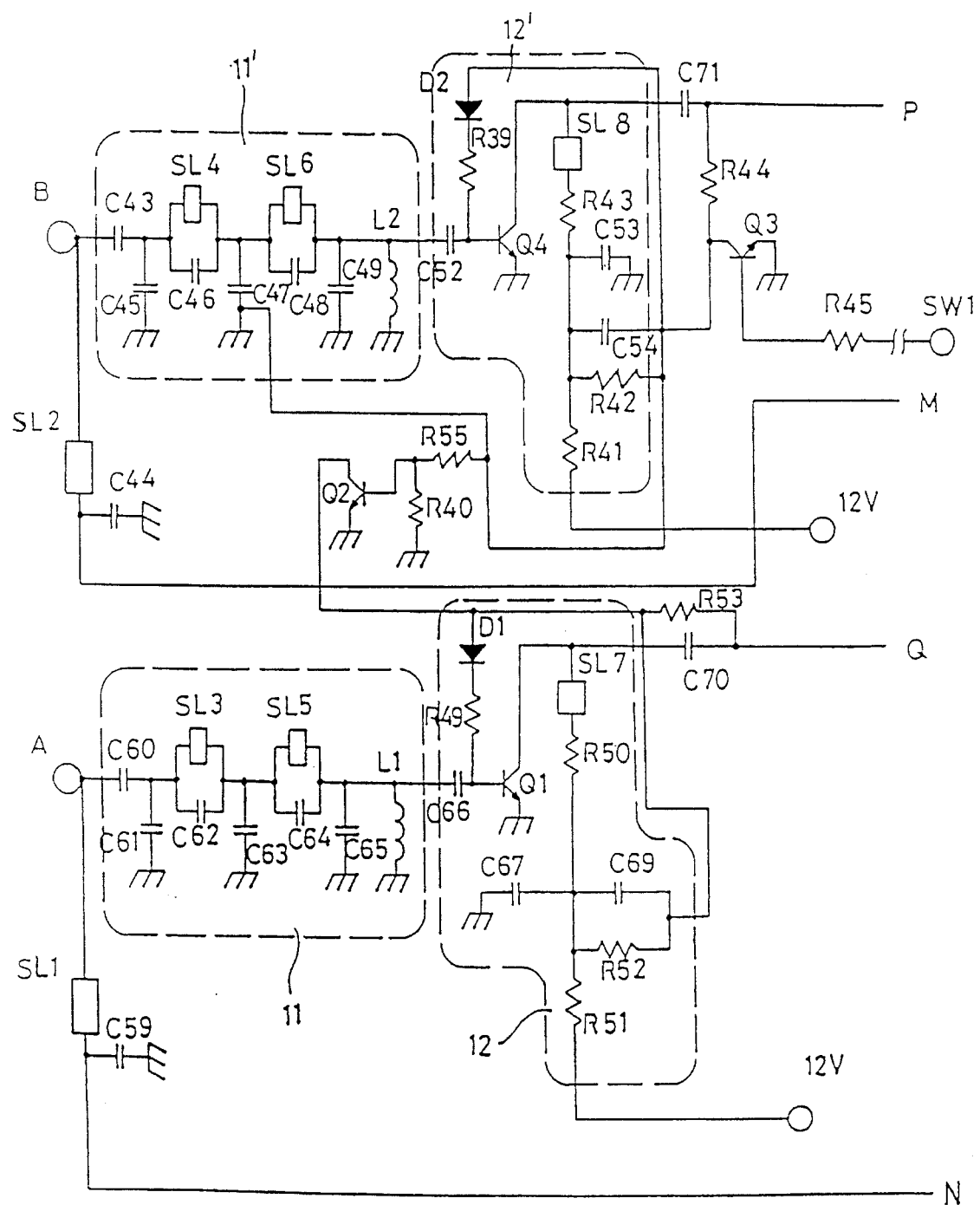
FIG. 2 is a circuit diagram of the radio frequency input device according to the present invention.
Figure 3:
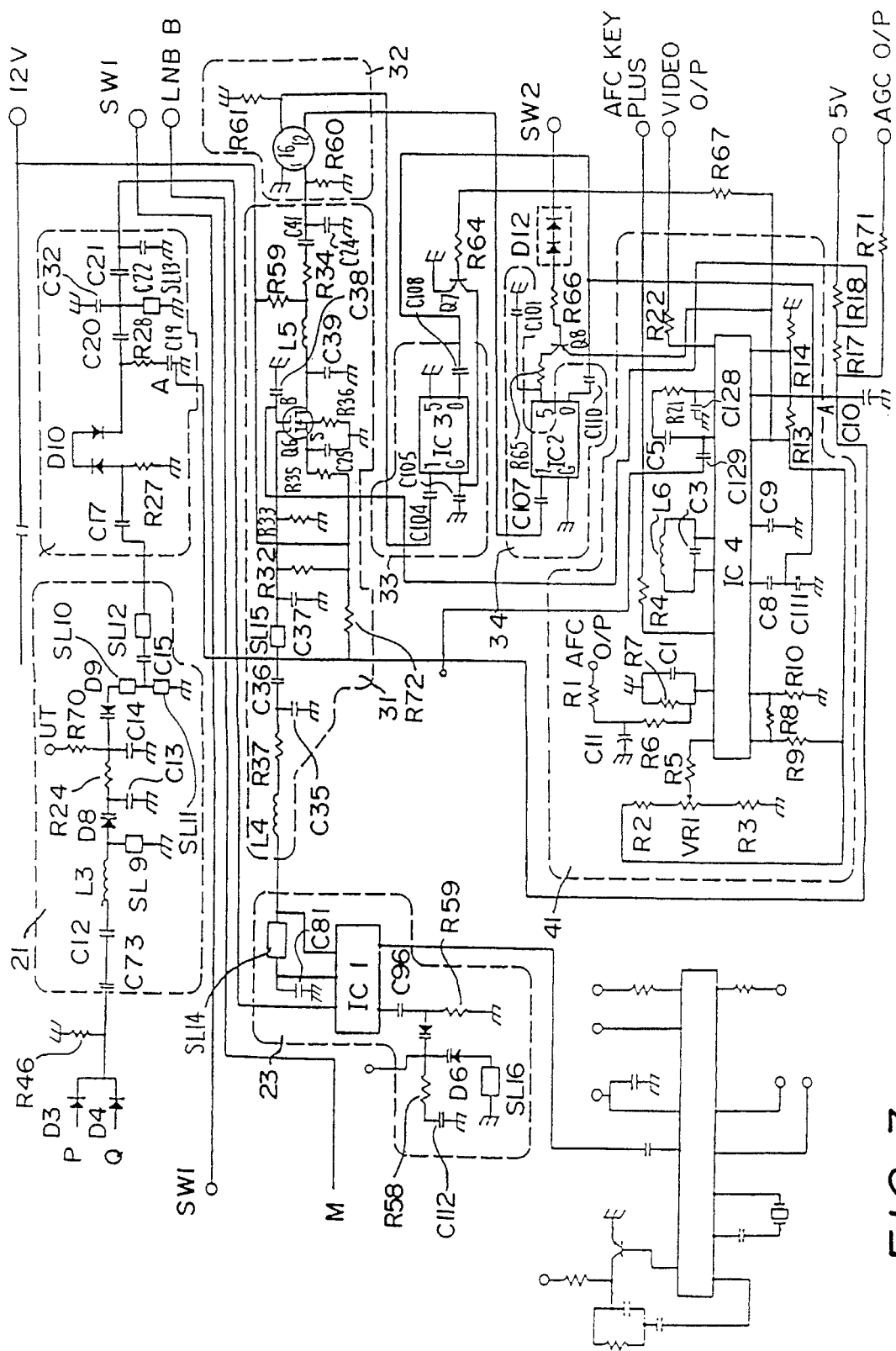
FIG. 3 is a circuit diagram of the frequency converter and the intermediate frequency amplifier unit according to the present invention.
Figure 4:
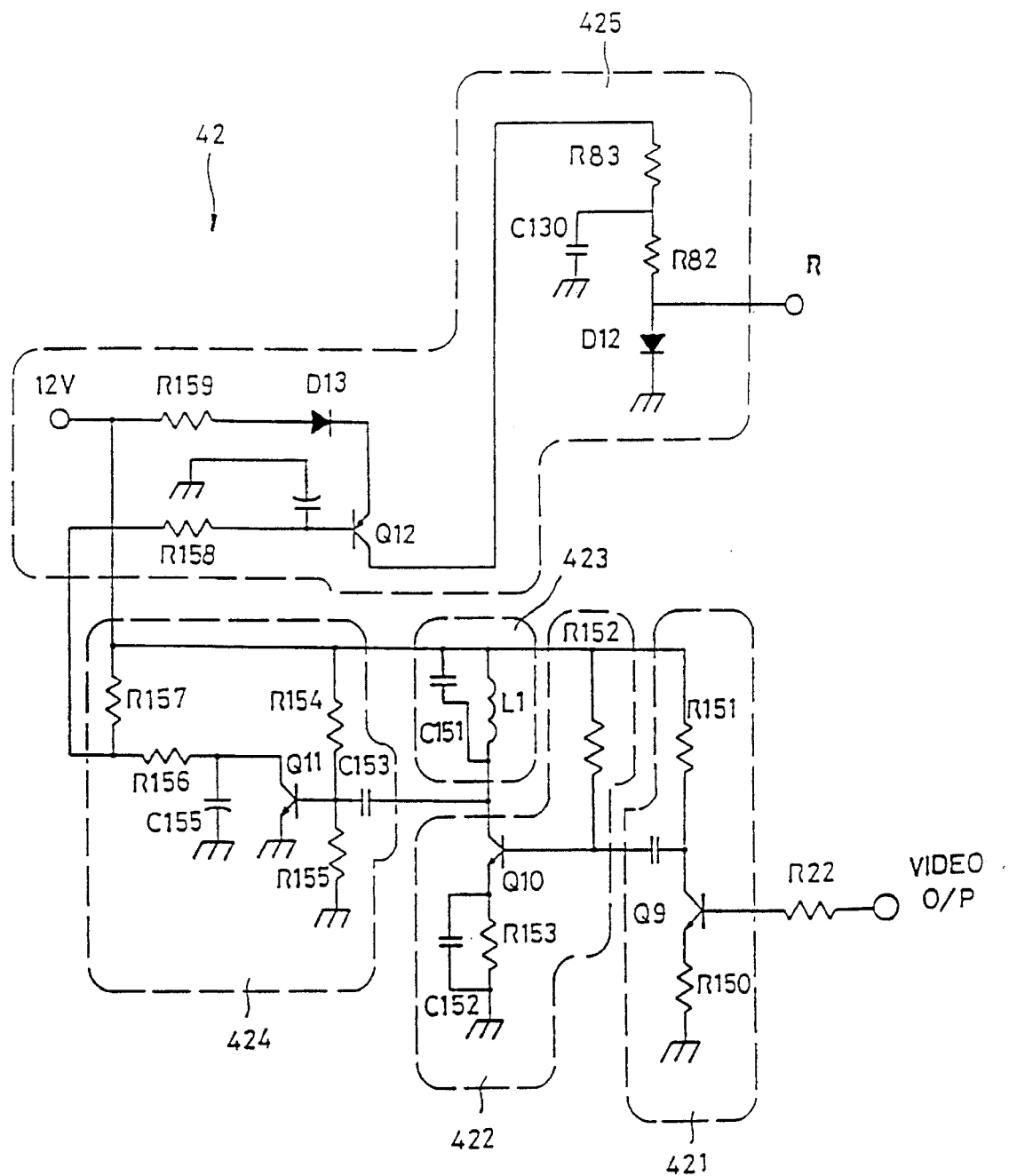
FIG. 4 is a circuit diagram of the auto threshold control demodulator according to the present invention.

Referring to FIGS. 2, 3, and 4, and FIG. 1 again, radio frequency input device 1 is comprised of low-pass filters 11 and 11', radio frequency amplifiers 12 and 12', and switching circuit 13. The input terminals of radio frequency amplifiers 12 and 12' are respectively connected to output terminals of low-pass filters 11 and 11', and output terminals thereof are respectively connected to a respective input end at switching circuit 13. The output end of switching circuit 13 is connected to frequency converter 2.

The radio frequency signal (950 MHz–2050 MHz) from the satellite antenna is received by low-pass filters 11 and 11' through terminal A or B by means of the control of switching circuit 13. switching circuit 13 is comprised of A/B terminal option switch SW1, transistors Q2 and Q3, diodes D3 and D4, resistors R44, R45 and R53, and capacitors C70 and C71. When A/B terminal option switch SW1 of switching circuit 13 is at high potential, transistor Q2 and diode D4 are electrically connected, transistor Q3 and diode D3 are electrically disconnected, and therefore low pass filter 11 receives the radio frequency signal (950–2050 MHZ) and eliminates frequency over 2050 MHz to let impedance be matched. Low pass filter 11 consists of capacitors C60, C61, C62, C63, C64 and C65, inductor L1 and microstrip line circuit SL3 and SL5. The output signal from low pass filter 11 is sent to radio frequency amplifier 12 for amplification. Radio frequency amplifier 12 consists of coupling capacitor C66 transistor Q1, diode D1, bias resistors R49, R50 and R51, ground capacitor C67, decoupling circuit R52 and C69, and microstrip line circuit SL7. The amplified signal from radio frequency amplifier 12 is then sent to frequency converter 2 through capacitor C70 and diode D4. Decoupling circuit R52 and C69 of radio frequency amplifier 12 prohibits high-frequency signal from passing through resistor R53 to diode D4.

Similarly, when A/C terminal option switch SW1 of switching circuit 13 is at low potential, transistor Q3 and diode D3 are electrically connected, transistor Q2 and diode D4 are electrically disconnected, and therefore radio signal is inputted into radio frequency input device 1 through terminal B and then sent to low pass filter 11', which consists of capacitors C43, C45, C46, C47, C48 and C49, inductor L12 and microstrip line circuit SL4 and SL6, permitting frequency over 2050 MHz to be removed and impedance matched. The output signal from low pass filter 11' is sent to radio frequency amplifier 12' for amplification, which radio frequency amplifier 12' consists of coupling capacitor C52, transistor Q4, diode D2, bias resistors R39, R41 and R43, ground capacitor C53, decoupling circuit R42 and C54, and microstrip line circuit SL8.

The amplified output signal from radio amplifier 12' is then sent to frequency converter 2 through capacitor C71 and diode D3. Decoupling circuit R42 and C54 of radio frequency amplifier 12' prohibits high-frequency signal from passing through resistor R44 to diode D3.

Frequency converter 2 consists of tracking filter 21, attenuation circuit 22, and microwave monolithic integrated circuit (MMIC) 23. The input terminal of tracking filter 21 is connected to the output terminal of radio frequency input device 1, and its output terminal is connected to the input terminal of attenuation circuit 22. The output terminal of attenuation circuit 22 is connected to the input terminal of microwave monolithic integrated circuit 23. The output terminal of microwave monolithic integrated circuit 23 is connected to intermediate frequency amplifier unit 3. The internal circuit of attenuation circuit 22 is connected with automatic gain control (AGC). Tracking filter 21 which consists of inductor L3, resistors R24 and R70, capacitors C12, C13, C14, C15, C73, C75 and C76, variable diodes D8 and D9, and microstrip line circuit SL9, SL10, SL11 and SL12, receives the output signal from radio frequency input device 1 and removes image frequency from the signal. The output signal from tracking filter 21 is then sent to attenuation circuit 22, which consists of coupling capacitor C17, diode D10, resistors R27 and R28, capacitors C19, C22 and C32, and matching circuit C20, C21 and SL13. Matching circuit C20, C21 and SL13 is to constrain low frequency signal from gaining. Attenuation circuit 22 attenuates the output signal from tracking filter 21 so as to eliminate interference of noises during high intensity of signal. By means of the control of automatic gain control 5, attenuation circuit 22 controls the gaining or reducing of the signal passing through. The attenuated signal from attenuation circuit 22 is then sent to microwave monolithic integrated circuit 23 for amplification. Microwave monolithic integrated circuit 23 which consists integrated circuit IC1, resistors R58 and R59, variable capacitance diodes D6 and D7, receives the output signal from attenuation circuit 21 and processes the signal into an intermediate frequency signal, by means of the superheterodyne operation of its internal radio frequency amplifier and voltage control oscillator, for output to intermediate frequency amplifier unit 3 for amplification.

Intermediate frequency amplifier unit 3 consists of first stage intermediate frequency amplifier 31, SAW filter 32, and second stage intermediate frequency amplifiers 33 and 34. The input terminal of first stage intermediate frequency amplifier 31 is connected to the output terminal of frequency converter 2. The output terminal of first stage intermediate frequency amplifier 31 is connected to the input terminal of SAW filter 32. The output terminal of SAW filter 32 is connected to the input terminals of second stage intermediate frequency amplifiers 33 and 34. The output terminals of second stage intermediate frequency amplifiers 33 and 34 are connected to the input terminal of variable bandwidth demodulator circuit 4. The internal circuit of first stage intermediate frequency amplifier 31 is connected with automatic gain control (AGC). First stage intermediate frequency amplifier 31 consists of MOSFET, bias resistors R32, R33, R34, R35, R36 and R69, ground capacitors C25 and C38, and matching circuit consisting of inductor L4, resistor R37, capacitors C24, C35, C36, and C41. First stage intermediate frequency amplifier 31 receives the intermediate frequency output signal from frequency converter 2 and then amplifies the signal, and also controls the gaining or reducing of the signal passing through by means of the operation of automatic gain control circuit. The output signal from first stage intermediate frequency amplifier 31 is then sent to SAW filter 32.

SAW filter 32 filtrates the signal of frequency bandwidth of 16 MHz or 27 MHZ and then sends the filtrated signal to second stage intermediate frequency amplifier 33, which consists of integrated circuit IC3, ground capacitor C105, and coupling capacitors C104 and C108, or to second stage intermediate frequency amplifier 34, which consists of integrated circuit IC2, ground capacitor C101, and coupling capacitors C107 and Cl10. Second stage intermediate frequency amplifier 33 is connected to 16/27 MHz selector switch SW2 through transistor Q7 and resistor R64. Second stage intermediate frequency amplifier 34 is connected to 16/27 MHz selector switch SW2 through transistor Q8 and diode D12.

When 16/27 MHz selector switch SW2 is switched to "HIGH", transistor Q7 is turned on transistor Q8 and diode D12 are turned off, therefore intermediate frequency signal of bandwidth 16 MHz is provided and sent to second stage intermediate frequency amplifier 33 for amplification and, the amplified signal from second stage intermediate frequency amplifier 33 is then sent to auto threshold control demodulator 4.

Similarly, when 16/27 MHz selector switch SW2 is switched to "LOW", transistor Q8 and diode D12 are turned on, transistor Q7 is turned off, therefore intermediate frequency signal of bandwidth 27 MHz is provided and sent to second stage intermediate frequency amplifier 34 for amplification and, the amplified signal from second stage intermediate frequency amplifier 34 is then sent to auto threshold control demodulator 4.

Auto threshold control demodulator 4 consists of demodulator circuit 41 and auto threshold control circuit 42. Demodulator circuit 41 is connected between intermediate frequency amplifier unit 3 and auto threshold control circuit 42. The internal circuit of demodulator circuit 41 is coupled to automatic gain control (AGC).

Demodulator circuit 41 which is comprised of integrated circuit IC4, capacitors C5, C8, C128 and C129, and resistor R21, . . . , demodulates the intermediate frequency signal outputted from intermediate frequency amplifier unit 3 and controls the gaining or reducing of the demodulated signal, so as to provide a satisfactory baseband frequency signal.

Referring to FIGS. 1 and 4 again, the auto threshold control circuit 42 is comprised of buffer 421, high-pass filter 422, resonance circuit 423, DC detector 424, and variable bandwidth circuit 425. The input terminal of buffer 421 is connected to the output terminal of demodulator circuit 41, and the output terminal thereof is connected to the input terminal of high-pass filter 422. The output terminal of high-pass filter 422 is connected to the input terminal of resonance circuit 423. The output terminal of resonance circuit 423 is connected to the input terminal of DC detector 424. The output terminal of DC detector 424 is connected to input terminal of variable bandwidth circuit 425. The output terminal of variable bandwidth circuit 425 is connected to the internal circuit of demodulator circuit 41.

Buffer 421 which consists of transistor Q9, resistor R150 and R151, and capacitor C150, receives the baseband signal from the output terminal of demodulator circuit 41 and then sends it to high-pass filter 422, which consists of transistor Q10, resistors R152 and R153, and capacitor C152. Buffer 421 also prohibits reverse transmission of the signal which already passed.

High-pass filter 422 receives the baseband signal from the output terminal of buffer 421 and filtrates high frequency from the signal, and then sends the filtrated signal to resonance circuit 423, which consists of inductor L1 and capacitor C151.

Resonance circuit 423 amplifies and reinforces the filtrated output signal from high-pass filter 422 to achieve the best gain, and then sends the processed signal to DC detector 424, which consists of capacitors C153 and C155, transistor Q11, and resistors R154, R155, R156, and R157.

DC detector 424 detects the output signal from resonance circuit 423 and converts it into a corresponding DC signal, and then sends it to variable bandwidth circuit 425, which consists of transistor Q12, resistors R82, R83, R158 and R159, capacitors C130 and C156, and diodes D12 and D13, so as to keep demodulator circuit 41 maintained effective within bandwidth 8–27 MHz to fit different weather conditions and antenna specifications, and therefore the signal receiving threshold of the tuner is automatically regulated to maintain high quality of TV picture. That is when 16/27 MHz selector switch SW2 is switched to "LOW" (the SAW filter allowable bandwidth is 27 MHz), variable bandwidth circuit 425 uses the DC signal from DC detector 424 to change the voltage at the collector of transistor Q12 and to reduce the amount of electric current passing through diode D13 so as to change its equivalent impedance, and therefore demodulator circuit 41 maintains the bandwidth within 16–27 MHz to fit different weather conditions and antenna specifications. When 16/27 MHz selector switch SW2 is switched to "HIGH" (SAW filter allowable bandwidth is 16 MHz), variable bandwidth circuit 425 uses the DC signal from DC detector 424 to change the voltage at the collector of transistor Q12 and to increase the amount of electric current passing through diode D13 so as to change its equivalent impedance, and therefore demodulator circuit 41 maintains the bandwidth within 8–16 MHz to fit different weather conditions and antenna specifications.

While only one embodiment of the present invention has been shown and described, it will be understood that various modifications and changes could be made without departing from the spirit and scope of the invention.

What is claimed is:

1. A direct broadcasting satellite tuner comprising:
   radio frequency input means for receiving and amplifying the radio frequency signal transmitted from a satellite antenna;
   frequency converting means for converting the signal outputted from said radio frequency input device into an intermediate frequency signal;
   intermediate frequency amplification means for amplifying the output intermediate frequency signal from said frequency converting means, then filtrating the amplified intermediate frequency signal by bandwidth of 16 MHz or 27 MHz, and then amplifying the filtrated signal; and
   auto threshold control demodulating means comprising of a demodulator circuit and an auto threshold control circuit; wherein:
      said demodulator circuit receives and demodulates the output signal from said intermediate frequency amplification means so as to obtain a satisfactory baseband signal by means of the control of an automatic gain control circuit;
      said auto threshold control circuit receives the output signal from said demodulator circuit and then changes the signal into a corresponding DC signal through filtration, resonance and amplification processing procedures for controlling the amount of electric current passing through and its equivalent impedance, so as to keep said demodulator circuit maintained effective within bandwidth 8–27 MHz to fit different weather conditions and antenna specifications and to automatically regulate the receiving threshold of the tuner.

2. The direct broadcasting satellite tuner of claim 1 wherein said auto threshold control circuit comprises:
   a buffer to receive the output baseband signal from said demodulator circuit and to let said signal pass, and to prohibit reverse transmission of the signal which already passed;
   a high-pass filter to receive the output baseband signal from said buffer and to remove high frequency from the signal;
   a resonance circuit to amplify and reinforce the filtrated output signal from said high-pass filter so as to achieve the best gain;
   a DC detector to detect the output signal from said resonance circuit and to change the signal into a DC signal; and
   a variable bandwith circuit controlled by the output DC signal from said DC detector to maintain said demodulator circuit with bandwidth 8–28 MHz so as to fit different weather conditions and antenna specifications and to automatically regulate the receiving threshold of the tuner.

3. The direct broadcasting satellite tuner of claim 1 wherein said radio frequency input means comprises:
   a first low-pass filter to receive the radio frequency signal from said satellite antenna and to remove frequency of bandwidth over 2050 MHZ from the signal;
   a first radio frequency amplifier to amplify the output signal from said first low-pass filter;
   a second low-pass filter to receive the radio frequency signal from said satellite antenna and to remove frequency of bandwidth over 2050 MHz from the signal; and
   a switching circuit controlled to let said first low-pass filter or said second low-pass filter to receive the radio frequency signal from said satellite antenna.

4. The direct broadcasting satellite tuner of claim 1 wherein said frequency converting means comprises:
   a tracking filter to receive the output signal from said radio frequency input means and to remove image frequency from the signal;
   an attenuation circuit to receive the output signal from said tracking filter and to attenuate the signal so as to eliminate the interference of noises when the intensity of the received signal is high; and a microwave monolithic integrated circuit to receive the output signal from said attenuation circuit and to process said signal into an intermediate frequency signal through a superheterodyne process.

5. The direct broadcasting satellite tuner of claim 1 wherein said intermediate frequency amplification means comprises:

a first stage intermediate frequency amplifier to receive and amplify the output intermediate frequency signal from said frequency converting means;

a SAW filter to filtrates the signal of frequency bandwidth of 16 MHz or 27 MHz from the amplified output intermediate frequency signal from said first stage intermediate frequency amplifier; and a set of second stage intermediate frequency amplifiers including a first second stage intermediate frequency amplifier to receive and amplify the intermediate frequency signal of bandwidth 16 MHz from said SAW filter, and a second second stage intermediate frequency amplifier to receive and amplify the intermediate frequency signal of bandwidth 27 MHz from said SAW filter.

6. The direct broadcasting satellite tuner of claim 4 wherein said attenuation circuit of said frequency converting means is coupled to an automatic gain control circuit to control the gaining and reducing of the output signal from said tracking filter.

7. The direct broadcasting satellite tuner of claim 5 wherein said first stage intermediate frequency amplifier of said intermediate frequency amplification means is coupled to an automatic gain control circuit to control the gaining and reducing of the intermediate frequency signal passing through.

* * * * *